United States Patent [19]
Uchiyama et al.

[11] Patent Number: 5,902,406
[45] Date of Patent: May 11, 1999

[54] LOW PRESSURE CVD SYSTEM

[75] Inventors: Taroh Uchiyama, Takasago; Yukio Yoshikawa, Yokohama; Takashi Tsukamoto, Yokohama; Jiro Nishihama, Yokohama, all of Japan

[73] Assignee: Asahi Glass Company Ltd., Tokyo, Japan

[21] Appl. No.: 08/818,096

[22] Filed: Mar. 14, 1997

[30] Foreign Application Priority Data

Mar. 15, 1996 [JP] Japan .................................... 8-087296
Dec. 27, 1996 [JP] Japan .................................... 8-357809

[51] Int. Cl.$^6$ .................................................. C23C 16/00
[52] U.S. Cl. .......................................... 118/724; 118/733
[58] Field of Search ..................................... 118/724, 725, 118/733, 723 R; 432/241, 250; 156/345

[56] References Cited

U.S. PATENT DOCUMENTS

| | | | |
|---|---|---|---|
| 4,419,332 | 12/1983 | Von der Ropp | 422/245 |
| 5,207,573 | 5/1993 | Miyagi et al. | 432/152 |
| 5,316,472 | 5/1994 | Niino et al. | 432/241 |
| 5,364,488 | 11/1994 | Minato et al. | 156/345 |
| 5,365,772 | 11/1994 | Ueda et al. | 73/40.7 |
| 5,478,397 | 12/1995 | Shibata et al. | 118/724 |
| 5,484,484 | 1/1996 | Yamaga et al. | 118/719 |
| 5,498,292 | 3/1996 | Ozari | 118/724 |
| 5,578,132 | 11/1996 | Yamaga et al. | 118/724 |
| 5,632,820 | 5/1997 | Taniyama et al. | 118/724 |

FOREIGN PATENT DOCUMENTS 5-166741  7/1993  Japan .

Primary Examiner—R. Bruce Breneman
Assistant Examiner—Luz Alejandro
Attorney, Agent, or Firm—Oblon, Spivak, McClelland, Maier & Neustadt, P.C.

[57] ABSTRACT

A low pressure CVD system comprising an inner tube having an upper end and a lower end opened, and made of a silicon carbide material, an outer tube including a circumferential wall surrounding an outer periphery of the inner tube with a predetermined spacing, an upper wall closing an upper end of the circumferential wall and a flange provided at a lower portion thereof, the outer tube having a lower end opened, a base portion for supporting the inner tube and the outer tube at the lower ends thereof, and for providing hermetic sealing between the lower end of the outer tube and the base portion, the base portion having a central portion formed with an opening, a lid provided for opening and shutting the opening in the base portion, and a furnace wall surrounding the circumferential wall and the upper wall of the outer tube, the furnace wall having a heater arranged on an inner side thereof wherein the outer tube is made of a silicon carbide material, and padding of a silicon carbide material is formed at a corner of a joined portion between the circumferential wall and the flange of the outer tube.

19 Claims, 8 Drawing Sheets

FIGURE 2(a) FIGURE 2(b)
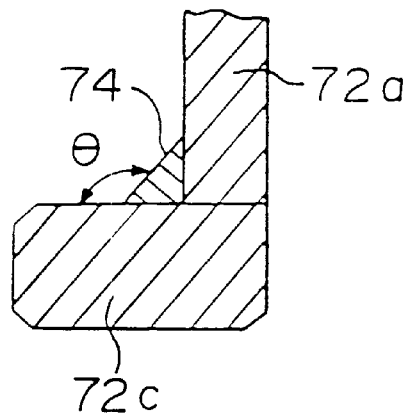
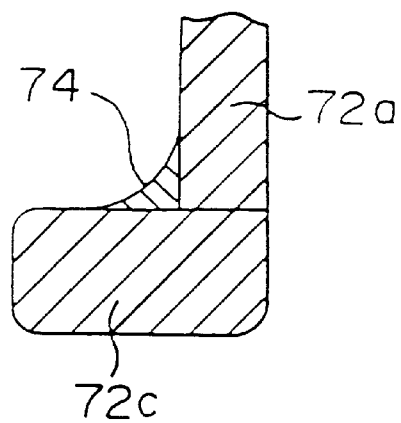
FIGURE 3
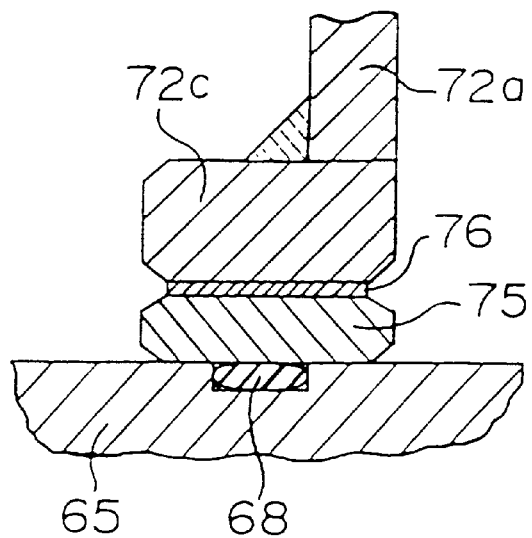

PRIOR ART

BACKGROUND ART

LOW PRESSURE CVD SYSTEM

BACKGROUND OF THE INVENTION

1. Field of the Invention

The present invention relates to a low pressure CVD (chemical vapor deposition) system which is used to form a film of e.g. silicon nitride on semiconductor wafers.

2. Description of the Related Art

As such a low pressure CVD system, there has been used a system as shown in FIG. 6 (see JP-A-93166741 corresponding to U.S. Pat. No. 5,316,472). In the low pressure CVD system shown, a dual tube 13 is constituted by an outer tube 11 and an inner tube 12. A base portion 14 is arranged under the outer tube 11 and the inner tube 12 to support the tubes 11 and 12. The base portion 14 is provided with a gas feed pipe 15 leading to a space in the inner tube 12, and an exhaust pipe 16 leading to a space between the inner tube 12 and the outer tube 11.

The base portion 14 has a lower surface formed with an opening, and a lid 17 which is vertically moved by a lift 18 is arranged to open and shut the opening. The lid 17 has a wafer boat 20 placed thereon through a pedestal 19, and the wafer boat 20 supports numbers of semiconductor wafers W. When the lid 17 is raised by the lift 18 the wafer boat 20 and the wafers W placed on the lid 17 through the pedestal 19 are loaded into the dual tube 13 and the lid 17 seals the opening of the base portion 14. When the lid 17 is lowered by the lift 18, the opening of the base portion 14 is opened, and the wafer boat 20 and the wafers W which have been placed on the lid 17 through the pedestal 19 are unloaded. A cylindrical furnace 21 with a heater is arranged along an outer periphery of the dual tube 13.

In the conventional low pressure CVD system, quartz glass has been used as the material for the outer tube 11. The reason is that it is easy to obtain high-purity quartz glass, and that use of quartz glass is preferable to prevent contamination of the semiconductor wafers W. Since quartz glass has sufficient heat-resistance and a significantly low thermal expansion coefficient for the outer tube of a low pressure CVD system, no fracture due to thermal stress has not occurred even if a temperature difference is created between a portion of the outer tube which is arranged in the furnace 21 and a portion of the outer tube arranged below the furnace 21. Because quartz glass has low thermal conductivity the temperature of a lower end of the outer tube is hardly raised, and it is easy to provide hermetic sealing.

When the conventional low pressure CVD system is used to deposit a film on the semiconductor wafers W by CVD technique, CVD films are deposited on an inner surface of the outer tube 11 and on the inner tube 12 as well. Since the CVD films on the outer tube and the inner tube peel off easily to produce particles having created a problem in that the semiconductor wafers W are contaminated. As a result, it has been necessary to frequently carry out operations wherein the outer tube 11 and the inner tube 12 are cleaned to remove the CVD films deposited on the tubes.

SUMMARY OF THE INVENTION

The inventors have thought that the reason why the CVD films peel off to produce the particles in the conventional low pressure CVD system is that the difference between the thermal expansion coefficient of quartz as the material of the outer tube 11 ($0.54 \times 10^{-6}$/° C.) and the thermal expansion coefficient of CVD films such as silicon nitride ($4 \times 10^{-6}$–$7 \times 10^{-6}$/° C.) is great.

The inventors have thought that the outer tube 11 could be made of silicon carbide to solve the problem of generation of the particles because the thermal expansion coefficient of silicon carbide ($4.5 \times 10^{-6}$/° C.) is near to the thermal expansion coefficient of CVD films such as silicon nitride.

However, when a silicon carbide material is used for preparation of the outer tube 11, there has been found new problem in that heat is conducted from a portion of the outer tube 11 which is arranged in the furnace 21 to a portion of the outer tube which will contact with the base portion 14 below the furnace 21, and that when the outer tube is contacted with the base portion 14 in a cooled state a great temperature gradient is generate in the vicinity of the portion of the outer tube in touch with the base portion so as to easily cause fracture due to thermal stress because silicon carbide has a greater Young's modulus, a greater thermal expansion coefficient and greater thermal conductivity in comparison with quartz glass.

In FIG. 7, there is shown a state wherein an outer tube 22 which is made of a silicon carbide material is put on a base portion 65 through a seal ring 68 inserted in an annular groove 65a on the base portion. The outer tube 22 is constituted by a cylindrical circumferential wall 22a, an upper wall 22b closing an upper end of the circumferential wall 22a, and a flange 22c provided at the outer periphery of a lower end of the circumferential wall 22a. The seal ring 68 is arranged at a central portion of a lower surface of the flange 22c.

However, in such a usual structure, a portion of the circumferential wall 22a which is near to the heater of the furnace 21 is heated to a high temperature while a portion of the circumferential wall which contacts with the base portion 65 is kept at a low temperature. The difference between the thermal expansion of both portions makes the diameter of the circumferential wall 22a in the vicinity of the lower end thereof smaller, causing the flange 22c to be tapered so as to be downwardly slanted in a radially outward direction as shown in FIG. 7. As a result, the flange 22c has an outer periphery of the lower surface strongly contacted with the base portion 65 to be reacted against a load W. In addition, since the flange has only the outer periphery side contacted with the base portion, cooling is made on the outer periphery side, creating a temperature difference between the inner periphery and the outer periphery of the flange.

This causes significant tensile stress to be applied to the outer periphery and an upper surface A of the flange 22c in a circumferential direction. When the space in the outer tube 22 is evacuated, the flange 22c is strongly pressed against an upper surface of the base portion 65 to apply significant bending stress to a joined portion C between the circumferential walls 22a and the flange 22c. Thus, the outer tube 22 which is made of a silicon carbide material is ruptured in a short period of time and offers no sufficient durability. Although it is shown in FIG. 7 that a lower portion B of the circumferential wall and others are greatly bent, the thermal deformation state is shown in exaggeration and they are not bent to such degree in practice.

It is an object of the present invention to provide a low pressure CVD system which is hardly susceptible to contamination caused by particles produced by peeling of CVD films, and which can give superior durability to an outer tube.

According to a first aspect of the present inventions there is provided a low pressure CVD system comprising an inner tube having an upper end and a lower end opened, and made of a silicon carbide material; an outer tube including a circumferential wall surrounding an outer periphery of the inner tube with a predetermined spacing, an upper wall closing an upper end of the circumferential wall and a flange provided at a lower portion thereof, the outer tube having a lower end opened; a base portion for supporting the inner tube and the outer tube at the lower ends thereof a and for providing hermetic sealing between the lower end of the outer tube and the base portion, the base portion having a central portion formed with an opening; a lid provided for opening and shutting the opening in the base portion; and a furnace wall surrounding the circumferential wall and the upper wall of the outer tube, the furnace wall having a heater arranged on an inner side thereof; wherein the outer tube is made of a silicon carbide material, and padding of a silicon carbide material is formed at a corner of a joined portion between the circumferential wall and the flange of the outer tube.

According to a second aspect of the present invention, there is provided a low pressure CVD system comprising an inner tube having an upper end and a lower end opened, and made of a silicon carbide material; an outer tube surrounding an outer periphery of the inner tube with a predetermined spacing, and having an upper end closed, a lower end opened and a lower periphery formed with a flange; a base portion for supporting the inner tube and the outer tube at the lower ends thereof, and having a central portion formed with an opening; a seal ring interposed between a lower surface of the flange and the outer tube and the base portion; a lid provided for opening and shutting the opening in the base portion; and a furnace wall surrounding the circumferential surface and an upper surface of the outer tube, the furnace wall having a heater arranged on an inner side thereof; wherein the outer tube is made of a silicon carbide material, and the outer tube primarily supported by having an inner circumferential portion of the flange inside the seal ring directly or indirectly contacted with the base portion.

In accordance with the present invention, the outer tube is made of a silicon carbide material which has a thermal expansion coefficient near to that of a CVD film. As a result, the CVD film which has deposited on an inner surface of the outer tube is hardly susceptible to peel off. Since the outer tube can be repeatedly used until the CVD film becomes thick to a certain degree, the number of cleaning operations required for removing the CVD film can be significantly reduced.

According to the first aspect of the present invention, the padding of a silicon carbide material can be formed at the corner of the joined portion between the circumferential wall and the flange of the outer tube to prevent thermal stress from concentrating on the corner of the joined portion between the circumferential wall and the flanges avoiding fracture of the outer tube.

It is preferable that the flange has a corner chamfered or formed with a radius in addition to formation of the padding, and that the lower end of the outer tube is distant from the lowest portion of the heater by not less than 200 mm.

According to the second aspect of the present invention, the outer tube is primarily supported by having the inner circumferential portion of the flange inside the seal ring directly or indirectly contacted with the base portion. Even if, as shown in FIG. 8, the diameter of the circumferential wall 72a in the vicinity of a lower portion of the outer tube 72 becomes relatively smaller by a thermal expansion difference to cause the flange 72c to be tapered and downwardly slanted in a radially outward direction, a load W applied by the outer tube 72 is supported at the inner circumferential portion inside the seal ring 68. Since the flange 72c is cooled through the inner circumferential portion, tensile stress applied to an outer periphery and an upper surface A of the flange 72c and bending stress applied to the lower portion C of the circumferential wall 72a can be reduced to prevent the outer tube 72 from being fractured.

BRIEF DESCRIPTION OF THE DRAWINGS

In drawings:

FIGS. 2(a) and (b) are cross-sectional views showing different examples of the form of a flange of an outer tube in the low pressure CVD system;

FIG. 3 is a cross-sectional view showing another example of the form of the flange of the outer tube in the low pressure CVD system;

DETAILED DESCRIPTION OF THE PREFERRED EMBODIMENTS

Figure 1:
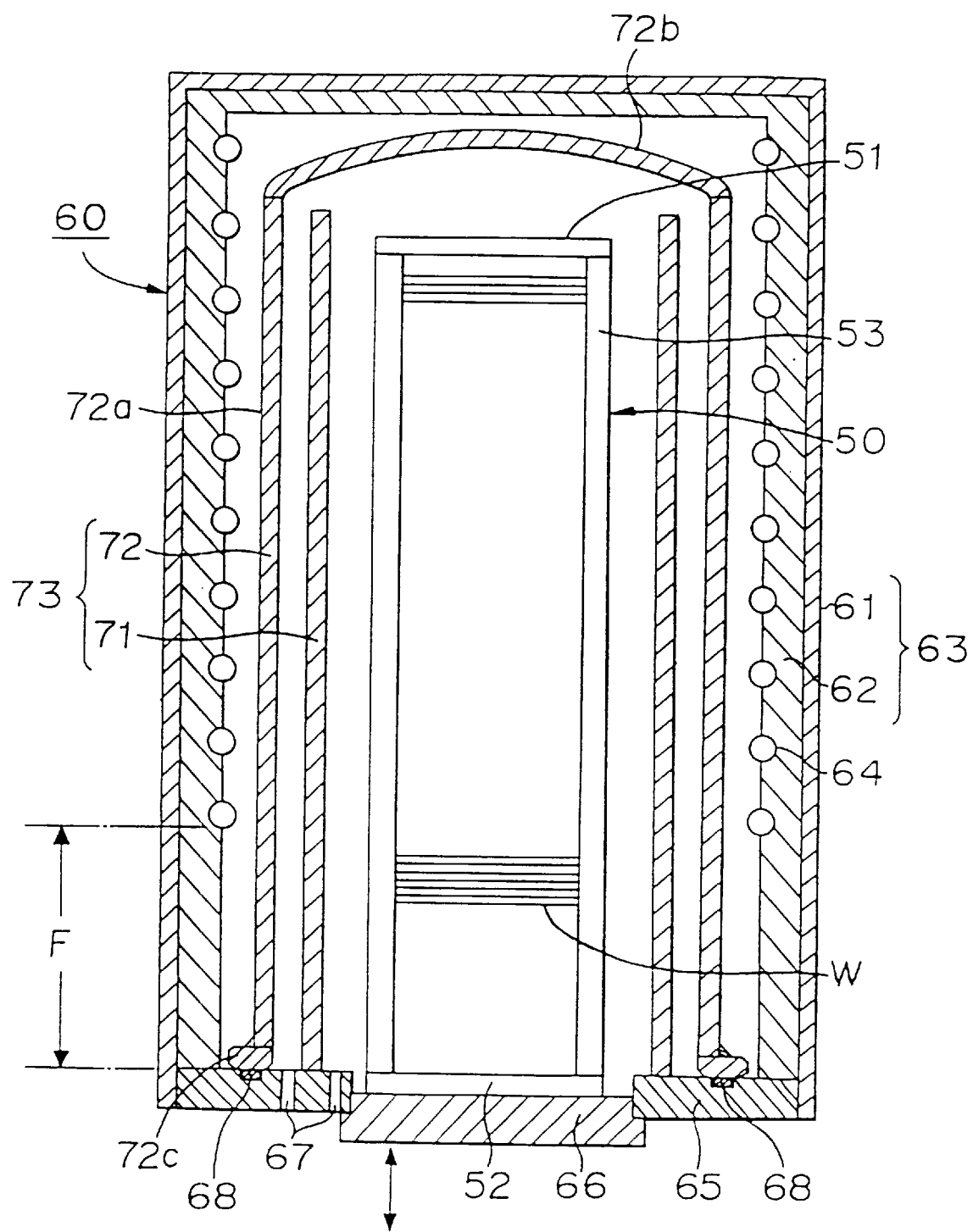
FIG. 1 is a cross-sectional view of the low pressure CVD system according to an embodiment of the present invention.

In FIGS. 1–3, there is shown the low pressure CVD system according to an embodiment of the first aspect of the present invention As shown in FIG. 1 the low pressure CVD system 60 includes a furnace wall 63 which is constituted by a metallic housing 61 and a heat insulating material 62 stuck on an inner peripheral wall of the metallic housing. The furnace wall 63 has an inner peripheral side provided with a heater 64, and the furnace wall 63 has a lower end closed by a base portion 65. The base portion 65 has a central portion formed with an opening as an inlet and outlet for loading and unloading semiconductor wafers W. There is provided a lid 66 which is vertically moved by a lift (not shown) to selectively open and close the opening. The base portion 65 is also formed with a gas feed aperture 67 and a gas exhaust aperture 67.

On the base portion 65 is put a dual tube 73 which is constituted by an inner tube 71 having upper and lower ends opened and made of a silicon carbide materials and an outer tube 72 surrounding an outer periphery of the inner tube 71 with a predetermined spacing and made of a silicon carbide material as well. The outer tube 72 is constituted by a cylindrical circumferential wall 72a, an upper wall 72b closing an upper end of the circumferential wall 72a, a flange 72c provided on an outer periphery of a lower end of the circumferential wall 72a. A seal ring 68 which is made of e.g. a heat-resistant elastomer are provided at a part of the base portion 65 which the flange 72c has a lower surface contacted with. In the base portion 65 is formed a water jacket (not shown) to prevent the seal ring 68 from being thermally damaged.

It is preferable that an adhesive agent 74 made of slurry with silicon carbide contained therein is applied to form padding at a corner of a joined portion between the circumferential wall 72a of the outer tube 72 and the flange 72c so that the corner exhibits an obtuse angle θ as shown in FIG. 2(a). In details the padding has a vertical cross-sectional shape of a right triangle, and the right triangle has a bottom arranged with respect to the flange at the obtuse supplementary angle θ. The angle θ is preferable not less than 110°. The flange 72c has corners chamfered.

Padding 74 made of a silicon carbide material may be formed at the corner of the joined portion between the circumferential wall 72a of the outer tube 72 and the flange 72c so that the padding has a vertical cross-sectional shape curved by a radius R to have the corner formed with a radius as shown in FIG. 2(b). In detail, the padding has the vertical cross-sectional shape formed to be arced so as to present an outer concave surface, and the padding has the outer surface tangent to the flange surface and the outer peripheral surface of the outer tube. It is preferable that the outer concave surface has an arc of a radius of 1 5 mm. It is also preferable that the flange 72c has corners formed with a radius. It is preferable that the radius of the corners is 1–4 mm If the vertical cross-sectional area of the padding is too small, thermal stress is insufficiently released. If the vertical cross-sectional area is too great, interference with a heater or insulating material can be caused. A preferable range of the vertical cross-sectional area is 1–15 mm².

The distance F from the lower surface of the flange 72c of the outer tube 72 to the lowest portion of the heater 64 is preferably not less than 200 mm, in particular not less than 400 mm.

In another embodiment shown in FIG. 3, the flange 72c of the outer tube 72 has the lower surface bonded to a quartz glass ring 75 through an adhesive layer 76, and the quartz glass ring has a lower surface pressed against a seal ring 68 such as an O ring to provide hermetic sealing As the adhesive layer 76 is preferably used a heat-resistant resin or a glass frit adhesive agent. The quartz glass ring 75 functions to reduce conduction of heat from the outer tube 72 to the seal ring 68 and to diminish excessive cooling of a lower portion of the outer tube 72 by the base portion 65 cooled by the water jacket.

Figure 4:
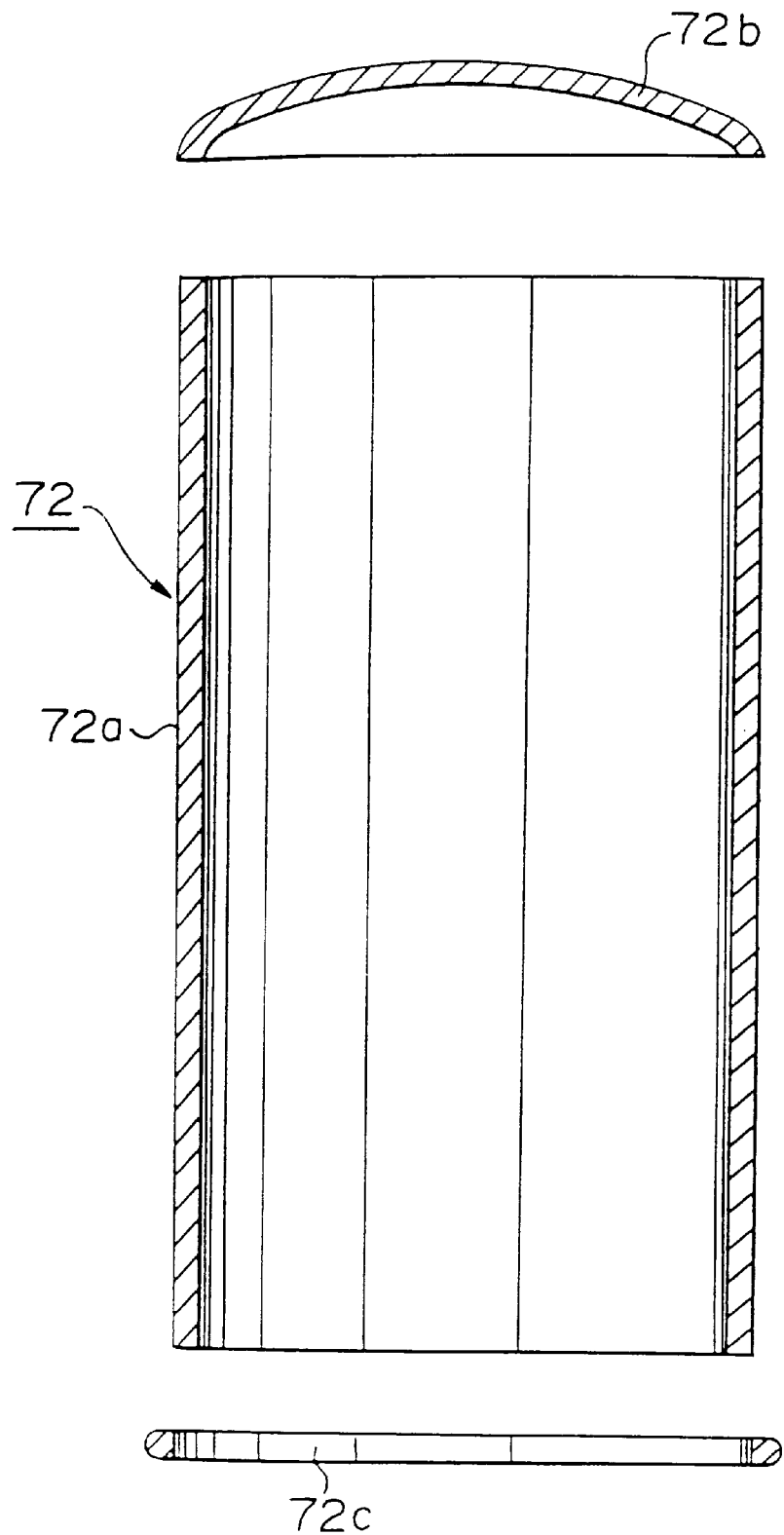
FIG. 4 is a cross-sectional view showing an example of parts constituting the outer tube in the low pressure CVD system.

Although the outer tube 72 can be monolithic molded, the outer tube may be prepared by independently molding the circumferential wall 72a, the upper wall 72b and the flange 72c as shown in FIG. 4 and then joining these members by an adhesive agent of silicon carbide. The respective members can be produced by a known method, using silicon carbide powder as a raw material Referring to FIG. 1 again, the lid 66 which is vertically moved by the lift not shown has a wafer boat 50 put thereon, and the wafer boat has numbers of the semiconductor wafers W received and supported therein.

Figure 5:
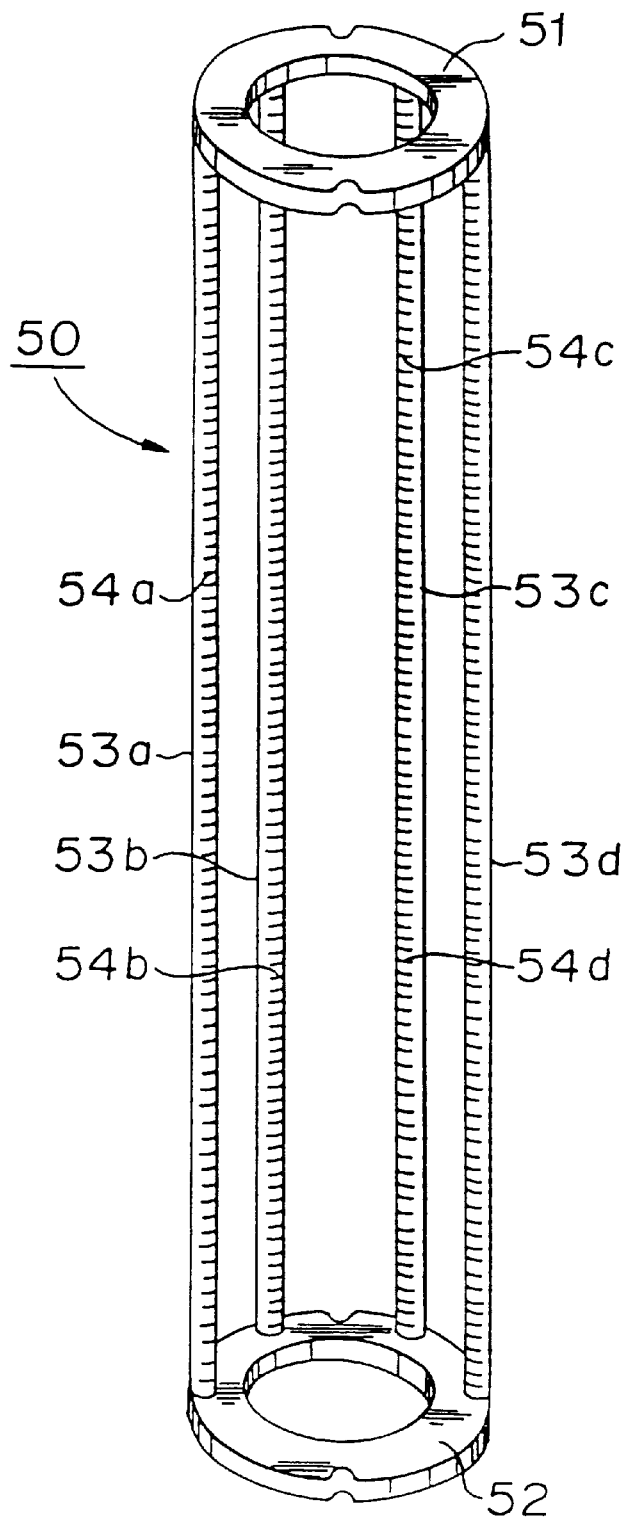
FIG. 5 is a perspective showing an example of the wafer boat used in the low pressure CVD system.
Figure 6:
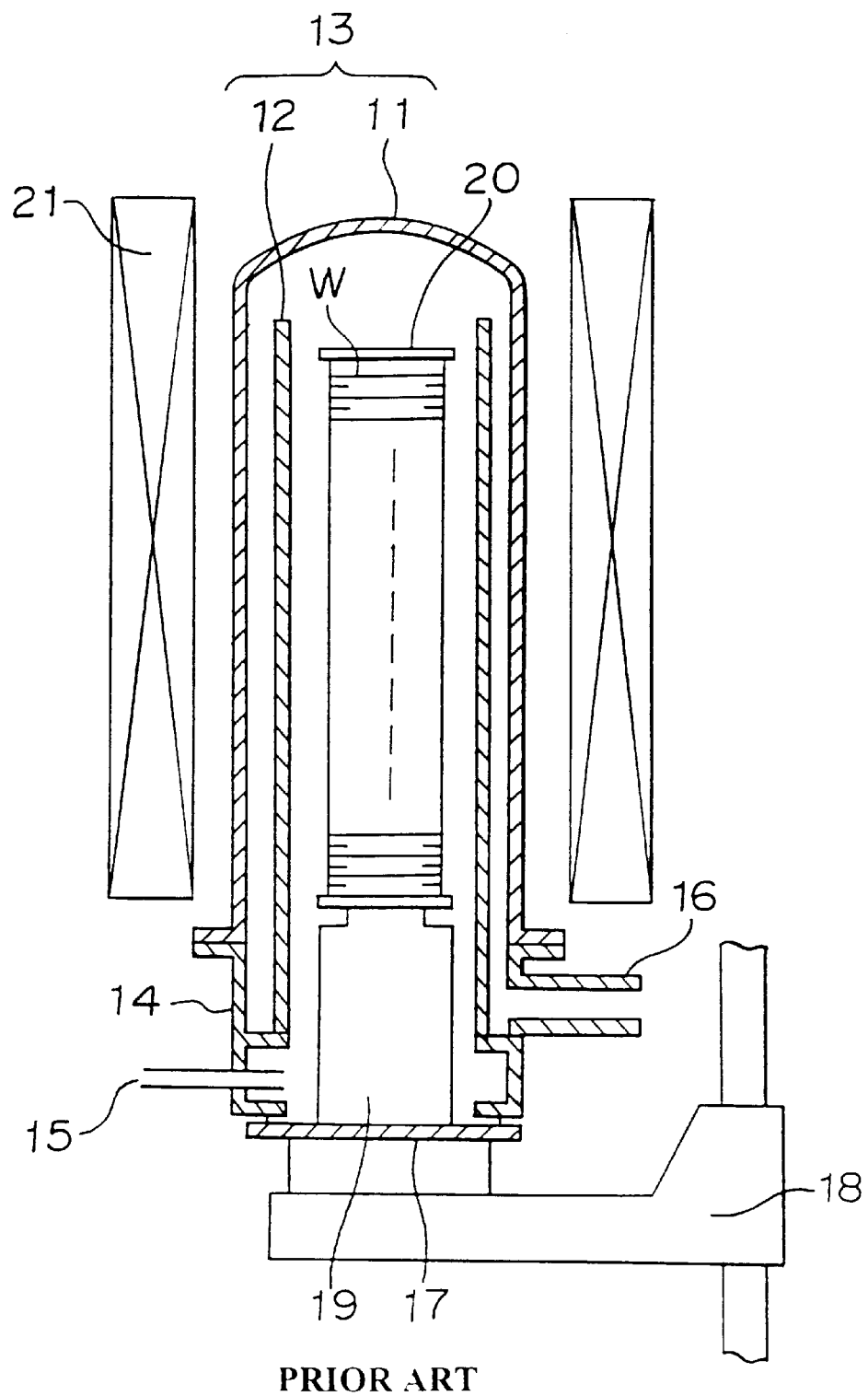
FIG. 6 is a cross-sectional view showing a conventional low pressure CVD system.

Referring to FIG. 5 as well, the wafer boat 50 includes a pair of annular end plates 51, 52 arranged at an upper position and a lower position, and a plurality of bars 53 connecting the end plates 51, 52, that is to say four bars 53a, 53b, 53c, 53d in the shown embodiment.

The bars 53a, 53b, 53c, 53d are joined to the end plates 51, 52 along outer periphery thereof at predetermined distances so that the semiconductor wafers W can be inserted laterally. The bars 53a, 53b, 53c, 53d have numbers of supporting grooves 54a, 54b, 54c, 54d formed therein at respective corresponding positions in height at predetermined pitches from the upper position to a lower position in order to receive and support the semiconductor wafers W.

The semiconductor wafers W are inserted into and supported by the supporting groves 54a, 54b, 54c, 54d from the top to the bottom.

Next, how to use the low pressure CVD system shown in FIG. 1 will be explained

Numbers of the semiconductor wafers W are inserted into and supported by the wafer boat 50, the wafer boat is put on the lid 66, the wafer boat is loaded into the dual tube 73, and the opening of the base portion 65 is closed by the lid 66. The space in the dual tube 73 is evacuated through the gas exhaust aperture 67, a reaction gas is introduced into the dual tube through the gas feed aperture 67, and a CVD film is deposited on the semiconductor wafers W. When deposition of the film has been completed evacuating the space in the dual tube 73 is stopped followed leaking it, and the lid 66 is lowered to unload the semiconductor wafers W supported by the wafer boat 50. By repeating such an operation, different CVD films can be repeatedly deposited on the semiconductor wafers W.

In the operations for film deposition, CVD films can be also deposited on an inner surface of the outer tube 72 and on the inner tube 71. When the CVD films peel off, particles are produced to contaminate the semiconductor wafers W, decreasing yield of products. For this reasons the CVD films on the outer tube 72 and the inner tube 71 must be removed by cleaning both tubes after a certain cycle of the operations. The cleaning operation has had been required to be frequently carried out, accounting for a decrease in operating performance of production.

However, in accordance with the present invention, the outer tube 72 and the inner tube 71 are both made of a silicon carbide material, and the silicon carbide material has a thermal expansion coefficient near to that of CVD films. This allows the CVD films to be difficult to peel off the tubes even if the CVD films become relatively thick, so that the intervals between the cleaning operations to be lengthened so as to shorten the down time of the CVD system, improving the operating performance of production.

When the outer tube 72 is made of a silicon carbide material with good thermal conductivity, the flange 72c at the lower end of the outer tube 72 which is contacted with the base portion 65 cooled by the water jacket is cooled to be kept at a low temperature while a portion of the outer tube 72 above the lower end is heated to a high temperature by the heater 64. As a result, thermal stress is generated by a steep temperature gradient, and the outer tube 72 can be easily fractured. However, in accordance with the present inventions the padding can be formed at the joined corner between the flange 72c and the circumferential wall of the outer tube 72 to release the thermal stress, preventing the outer tube 72 from being fractured.

Figure 8:
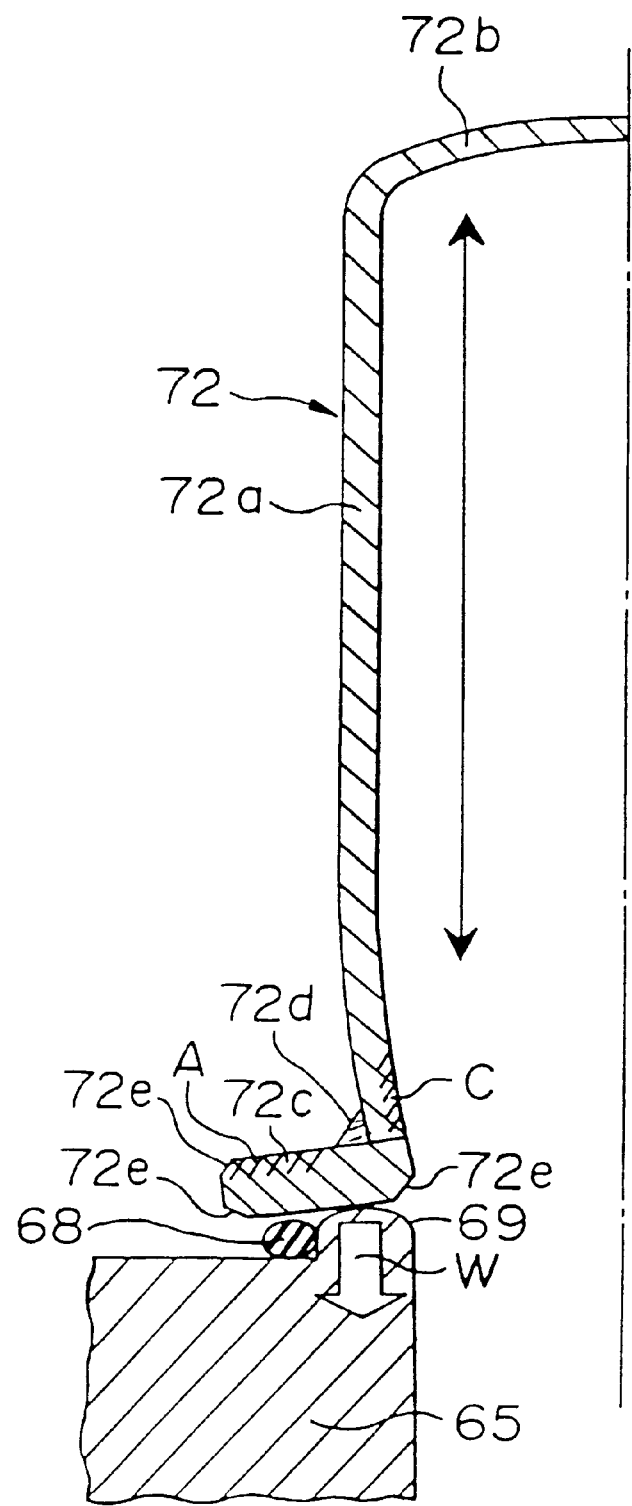
FIG. 8 is a cross-sectional view showing the essential portions of the low pressure CVD system according to another embodiment of the present invention.

Now, the second aspect of the present invention will be described in detail. As shown in FIG. 8, an annular projection 69 which is integral with the base portion 65, and the seal ring 68 which is arranged outside the projection. The projection 69 have a vertical cross-section in a curved shape, more specifically in a semicylindrical shape, and the flange 72c can have the lower surface evenly contacted with the projection at all times even if the flange is slanted by thermal deformation. The seal ring 68 is arranged outside the projection 69, and the seal ring is further compressed when the flange 72c is slanted by the thermal deformation. Although it is shown in FIG. 8 that the lower portion of the circumferential wall 72a of the outer tube 72 seems greatly bent, the thermal deformation state is shown in exaggeration, and the lower portion is not bent to such a degree in practice.

Like the first aspect of the present invention, an adhesive agent made of slurry with a silicon carbide material is applied to form the padding at a corner 72d of a joined portion between the outer peripheral surface 72a and the flange 72c of the outer tube 72 so that the corner exhibits an obtuse angle or is formed with a radius. In detail, the padding has a vertical cross-sectional shape of a right triangle, and the triangle has a bottom arranged with respect to the flange at an obtuse supplementary angle θ. The angle θ is preferably not less than 110°. The flange 72c has corners chamfered.

As shown in FIG. 2(b), padding 74 of a silicon carbide material may be formed at the corner of the joined portion between the circumferential wall 72a and the flange 72c of the outer tube 72 so that the padding has a vertical cross-sectional shape curved by a radius R to have the corner formed with a radius. Specifically, the padding has the vertical cross-section in an arced shape so as to present an outer concave surface, and the padding has the outer surface tangent to the flange surface and the outer peripheral surface of the outer tube. The radius of the padding is preferably 1–5 mm. It is preferable that the flange 72c has corners formed with a radius. It is preferable that the radius of the corner is 1–4 mm.

If the vertical cross-sectional area of the padding is too small, the thermal stress is insufficiently released. If the vertical cross-sectional area is too great, interference with a heater or insulating material can be caused. A preferable range is 1–15 mm$^2$.

When the outer tube 72 is made of a silicon carbide material with good thermal conductivity, the flange 72c of the outer tube 72 which contacts with the base portion 65 cooled by the water jacket is cooled to be kept at a low temperature, while a portion of the outer tube above the lower portion is heated to a high temperature by the heater 64. As a results the diameter of the circumferential wall 72a in the vicinity of the lower portion thereof becomes relatively smaller by a thermal expansion differences and the flange 72c is tapered so as to be downwardly slanted in a radially outward direction as shown in FIG. 8. When the space in the outer tube 72 is evacuated under such a state, a strong load W generates on the lower surface of the flange 72c of the outer tube 72 against the base portion 65 in a downward direction.

However, in accordance with the present invention, the projection 69 is formed on the base portion 65, and an inner circumferential portion of the flange 72c of the outer tube 72 is constantly contacted with and supported by the projection 69. As a result, the flange 72c can be cooled on the inner circumferential side to decrease tensile stress applied to an outer periphery and an upper surface A of the flange 72c and bending stress applied to the lower portion C of the circumferential wall 72a, preventing the outer tube 72 from being ruptured.

In this embodiment, the padding of a silicon carbide material is formed at the corner 72d of the joined portion between the circumferential wall 72a and the flange 72c of the outer tube 72 so that the corner exhibits an obtuse angle or is formed with a radius. In addition, the flange 72c has the corners 72e chamfered or formed with a radius. As a result, thermal stress can be prevented from concentrating on these portions to avoid fracture of the flange 72c in a more effective manner.

Figure 9:
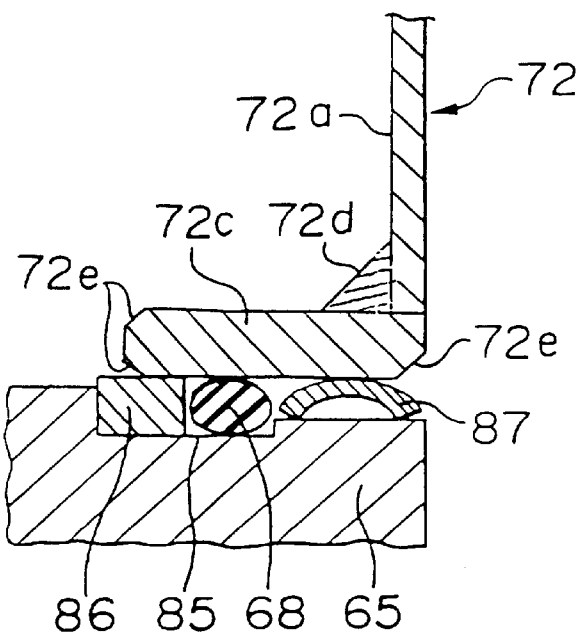
FIG. 9 is a cross-sectional view showing the essential portions of the low pressure CVD system according to another embodiment of the present invention.

In FIG. 9, there is shown the low pressure CVD system according to another embodiment of the present invention. In the explanation of the embodiment shown in FIG. 9, like reference numerals indicate the substantially same parts as the embodiments shown in FIGS. 1, 4 and 8, and explanation of those parts will be omitted.

In the embodiments the base portion 65 has an annular groove 85 formed thereon, and the groove 85 has a seal ring 68 arranged on an inner circumferential side therein and an annular supporting member 86 arranged on an outer circumferential side therein. The seal ring 68 and the supporting member 86 are both made of a heat-resistant synthetic resin such as fluororesin, or an elastomer. An annular leaf spring (s) 87 which has an arced cross-section is arranged inside the seal ring 68 on the base portion. The leaf spring(s) 87 has such elasticity to be flexibly deformably to some extent against a load applied from the lower surface of the flange 72c of the outer tube 72, and has a greater rigidity than the supporting member 86.

According to this embodiments when the outer tube 72 is thermally deformed as shown in FIG. 8, the flange 72c compresses the supporting member 86 at the outer periphery thereof to be downwardly slanted, and the load applied by the outer tube 72 is primarily supported by the leaf spring(s) 87. Since the leaf spring(s) 87 has such an arced cross-section and is elasticly deformable, the flange 72c can be free of uneven contact to avoid stress concentration and local cooling. As a result, the outer tube 72 can be prevented from being fractured in a more effective manner.

Figure 10:
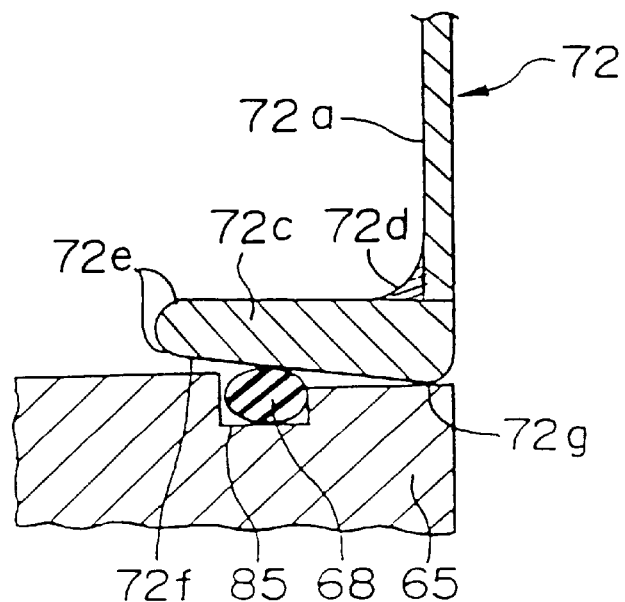
FIG. 10 is a cross-sectional view showing the essential portions of the low pressure CVD system according to another embodiment of the present invention.

In FIG. 10, there is shown the low pressure CVD system according to another embodiment of the present invention. In the explanation of this embodiment, like reference numerals indicate the substantially same parts as the embodiments shown in FIGS. 1, 4 and 8, and explanation of those parts will be omitted.

In this embodiment, the base portion 65 has an annular groove 85 formed thereon, and the groove 85 has the seal ring 68 engaged therein. The flange 72c of the outer tube 72 has the lower surface 72f formed to be tapered so as to be upwardly slanted in a radial outward direction, and the lower surface 72f has a corner 72g on the inner circumferential side formed to have a curved cross-section, or formed with a radius in this embodiment. The outer tube 72 is contacted with and supported by an upper surface of the base portion 65 at the corner 72g of the lower surface 72f of the flange 72c.

According to this embodiment, even if the outer tube 72 is thermally deformed as shown in FIG. 8, the presence of a gap between the outer periphery of the lower surface 72f of the flange 72c and the base portion 65 allows the outer tube 72 to be constantly supported at the corner 72g of the lower surface 72f of the flange 72c. Since the corner 72g of the lower surface 72f of the flange 72c is curved, the flange 72c can be evenly contacted with the base portion 65 at all times even if the flange 72c is slanted by thermal deformation. Such an arrangement can also prevent the outer tube 72 from being fractured effectively.

EXAMPLE 1

The outer tube 72 was prepared to have an outer diameter of 340 mm, an inner diameter of 332 mm, a wall thickness of 4 mm and a height of 1,200 mm. The inner tube 71 was prepared to have an outer diameter of 270 mm, an inner diameter of 262 mm, a wall thickness of 4 mm and a height of 1,100 mm. Both tubes was made from silicon carbide, and were combined into the dual tube 73. The adhesive agent 74 made from silicon carbide was applied to form padding at the corner of the joined portion between the circumferential wall 72a and the flange 72c of the outer tube 72 so that the corner was formed with a radius of 3 mm. The flange 72c was machined to have the corners formed with the same radius.

The dual tube 73 thus prepared was put in the low pressure CVD system shown in FIG. 1 The distance F from the lower surface of the flange 72c of the outer tube 72 to the lowest portion of the heater 64 was set to 350 mm.

Although the low pressure CVD system 60 was used to repeat the operations for CVD film deposition on semiconductor wafers W 40 times, the outer tube 72 was not fractured. The peeling state of the CVD films which had been deposited on the inner surface of the outer tube 72 was observed, and it was found that no peeling occurred.

EXAMPLE 2

The outer tube was prepared in the same manner as the Example 1 except that the substantially same amount of adhesive agent was applied to form the corner so that the corner exhibited an obtuse angle of not less than 120°, and that the flange had the corners chamfered by a width of 3 mm. The outer tube thus prepared was tested in the same way as the Example 1, and it was found that the same results as the embodiment 1 were obtained.

Comparative Example 1

The outer tube 72 was prepared in the same manner as the Example 1 except that the outer tube was made of quartz glass. The outer tube thus prepared was used to repeat the operations for CVD film deposition 40 times. Although the outer tube 72 was not fractured, it was observed that particles were generated by peeling of the CVD films deposited on the inner surface of the outer tube 72

EXAMPLE 3

The low pressure CVD system shown in FIGS. 1 and 8 was prepared so that the outer tube 72 had an outer diameter of 310 mm and a wall thickness of 4 mm, and the flange 72c had an outer diameter of 350 mm and a thickness of 12 mm. The CVD system was set so that the temperature of a portion of the outer tube 72 with the heater 64 arranged thereon (the temperature of an equally heated portion) was 780° C., the temperature of a portion of the outer tube in touch with the base portion 65 (the temperature of a cooled portion) was 250° C., and the distance from the lowest portion of the heater 64 to the lower surface of the flange 72c was 150 mm.

Figure 7:
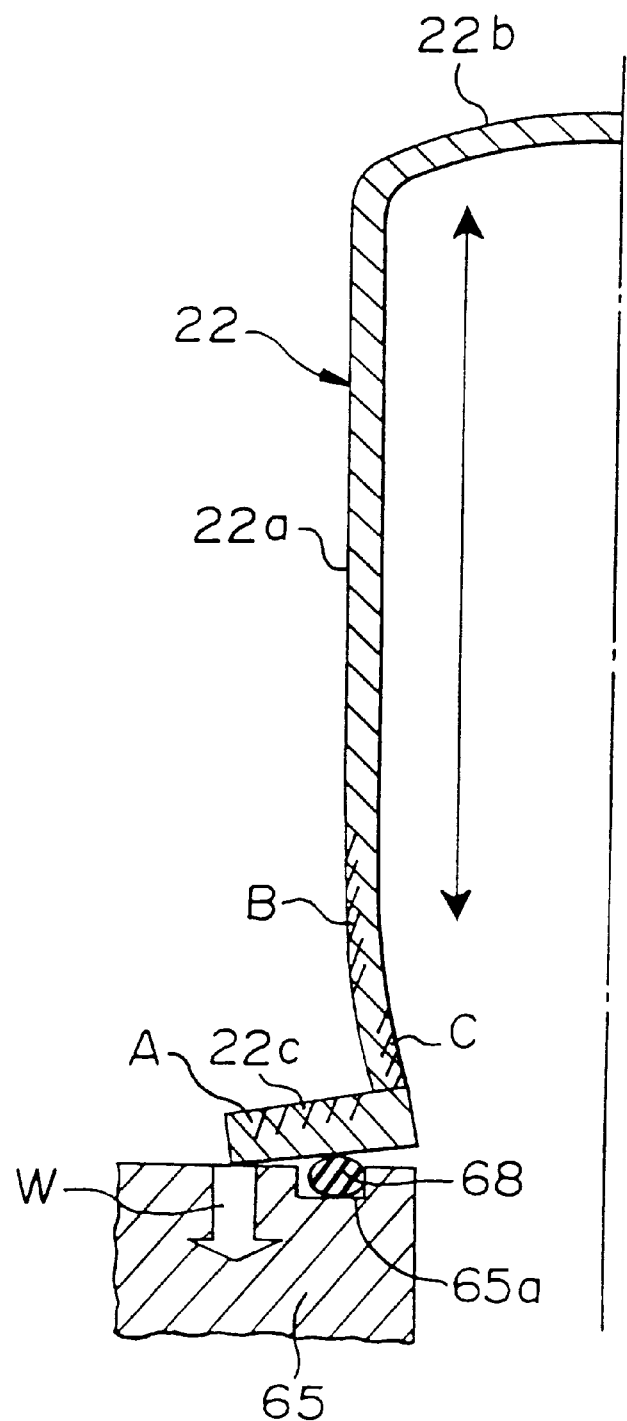
FIG. 7 is a diagram showing problems which are created when the outer tube for a low pressure CVD system is made of a silicon carbide material.

An example wherein the projection 69 was provided on the base portion 65 and the flange 72c had the inner circumferential portion of the lower surface contacted with the projection 69 under the conditions stated above was compared with a case wherein the base portion 65 was formed flat as shown in FIG. 7 so that the flange had the outer circumferential portion of the lower surface contacted with the base portion 65 when the flange was thermally deformed, for calculation of stress occurred in the respective cases.

The comparison showed that the stress on the upper surface of the flange due to heat distortion was 4.6 kgf/mm$^2$ maximum in the case shown in FIG. 7 while the stress was reduced to 3.1 kgf/mm$^2$ in the Example shown in FIGS. 1 and 8. It also showed that the stress at the outer periphery of the joined portion of the flange due to heat distortion and the inner vacuum was 6.6 kgf/mm$^2$ maximum in the case shown in FIG. 7 while such stress was reduced to 3.6 kgf/mm$^2$ in the Examples shown in FIGS. 1 and 8.

As explained, accordance with the present invention, the outer tube is made of a silicon carbide material which has a thermal expansion coefficient near to that of a CVD film. As a result, the CVD film which has deposited on the inner surface of the outer tube is difficult to peel off, and the outer tube can be repeatedly used until the CVD film on the outer tube become thick to a certain extent. Thus, the number of cleaning operations for removing the CVD film can be decreased to improve operating performance of production.

The padding made of a silicon carbide material can be formed at the corner of the joined portion between the outer peripheral surface and the flange of the outer tube to prevent the outer tube from being fractured due to concentration of thermal stress on these portions. When the flange has the corners chamfered or formed with a radius in addition to formation of the padding fracture prevention can be further improved.

When the distance from the lower end of the outer tube to the lowest portion of the heater is set to 200 mm, a heat gradient which occurs at the lower portion of the outer tube can be relieved to decrease thermal stress, preventing the lower portion of the outer tube from being fractured.

When the outer tube is primarily supported by having the inner circumferential portion of the flange inside the seal ring directly or indirectly contacted with the base portion, the tensile stress applied on the outer periphery and the upper surface of the flange and the bending stress applied to the lower portion of the circumferential wall can be reduced to prevent the outer tube from being fractured even if the outer tube is thermally deformed. The reason is that the load by the outer tube is constantly supported at a portion inside the seal ring.

What is claimed is:

1. A low pressure CVD system comprising:

an inner tube having an upper end and a lower end opened, and made of a silicon carbide material;

an outer tube including a circumferential wall surrounding an outer periphery of the inner tube with a predetermined spacing, an upper wall closing an upper end of the circumferential wall and a flange provided at a lower portion thereof, the outer tube having a lower end opened;

a base portion for supporting the inner tube and the outer tube at the lower ends thereof, and for providing hermetic sealing between the lower end of the outer tube and the base portion, the base portion having a central portion formed with an opening, said base portion including a cooling jacket for cooling the base portion;

a lid provided for opening and shutting the opening in the base portion; and a furnace wall surrounding the circumferential wall and the upper wall of the outer tube, the furnace wall having a heater arranged on an inner side thereof;

wherein the outer tube is made of a silicon carbide material, and padding of a silicon carbide material is formed at a corner of a joined portion between the circumferential wall and the flange of the outer tube, and the lower end of the outer tube is distant from the lowest portion of the heater by not less than 200 millimeters.

2. A low pressure CVD system comprising:

an inner tube having an upper end and a lower end opened, and made of a silicon carbide material;

an outer tube including a circumferential wall surrounding an outer periphery of the inner tube with a predetermined spacing, an upper wall closing an upper end of the circumferential wall and a flange provided at a lower portion thereof, the outer tube having a lower end opened;

a base portion for supporting the inner tube and the outer tube at the lower ends thereof, and for providing hermetic sealing between the lower end of the outer tube and the base portion, the base portion having a central portion formed with an opening;

a lid provided for opening and shutting the opening in the base portion; and a furnace wall surrounding the circumferential wall and the upper wall of the outer tube, the furnace wall having a heater arranged on an inner side thereof;

wherein the outer tube is made of a silicon carbide material, and padding of a silicon carbide material is formed at a corner of a joined portion between the circumferential wall and the flange of the outer tube so that the corner exhibits an obtuse angle or is formed with a radius, the flange has a corner chamfered or formed with a radius, and the lower end of the outer tube is distant from the lowest portion of the heater by not less than 200 mm.

3. A low pressure CVD system according to claim 2, wherein a ring made of quartz glass or ceramics is arranged under the flange of the outer tube, and a sealing member is interposed between the ring and the base portion.

4. A low pressure CVD system according to claim 2, wherein the padding has an average vertical cross-sectional area of 1–15 mm$^2$.

5. A low pressure CVD system according to claim 2, wherein the padding comprises a fired adhesive agent made of slurry with silicon carbide, and is provided to the corner of the joined portion between the circumferential wall and the flange.

6. A low pressure CVD system according to claim 2, wherein the padding has a vertical cross-sectional shape of a right triangle, and the right triangle has a bottom arranged with respect to the flange at an obtuse supplementary angle θ.

7. A low pressure CVD system according to claim 2, wherein the padding has a vertical cross-section in an arced shape so as to present an outer concave surface, and the outer concave surface has an arc of a radius of 1–5 mm.

8. A low pressure CVD system according to claim 2, wherein the upper wall, the circumferential wall and the flange of the outer tube, and the padding have silicon impregnated therein.

9. A low pressure CVD system comprising:

an inner tube having an upper end and a lower end opened, and made of a silicon carbide material;

an outer tube surrounding an outer periphery of the inner tube with a predetermined spacing, and having an upper end closed, a lower end opened and a lower periphery formed with a flange;

a base portion for supporting the inner tube and the outer tube at the lower ends thereof, and having a central portion formed with an opening;

a seal ring interposed between a lower surface of the flange of the outer tube and the base portion;

a lid provided for opening and shutting the opening in the base portion; and a furnace wall surrounding a circumferential surface and an upper surface of the outer tube, the furnace wall having a heater arranged on an inner side thereof;

wherein the outer tube is made of a silicon carbide material, and the outer tube is primarily supported by having an inner circumferential portion of the flange radially inward from the seal ring, said inner circumferential portion of the flange directly or indirectly contacted with the base portion;

wherein an annular projection having a curved cross-section is provided on the base portion radially inward from the seal ring, the projection formed integrally with or independently from the base portion, and the flange of the outer tube has the lower surface contacted with and supported by the projection.

10. A low pressure CVD system according to claim 9, wherein the projection is constituted by an annular leaf spring having an arced cross-section.

11. A low pressure CVD system according to claim 9, wherein an annular supporting member is provided on the base portion outside the seal ring, the supporting member made of a material liable to be compressed and deformed in comparison with the projection, and the flange of the outer tube has the lower surface contacted with the projection, the seal ring and the supporting member.

12. A low pressure CVD system according to claim 9, wherein padding made of a silicon carbide material is formed at a corner of a joined portion between an outer circumferential surface of the outer tube and the flange, and the flange has a corner chamfered or formed with a radius.

13. A low pressure CVD system according to claim 9, wherein the padding has an average vertical cross-sectional area of 1–15 mm$^2$.

14. A low pressure CVD system according to claim 9, wherein the padding comprises a fired adhesive agent made of slurry with silicon carbide, and is provided to the corner of the joined portion between the circumferential wall and the flange.

15. A low pressure CVD system according to claim 9, wherein the padding has a vertical cross-sectional shape of a right triangle, and the right triangle has a bottom arranged with respect to the flange at an obtuse supplementary angle θ.

16. A low pressure CVD system according to claim 9, wherein the padding has a vertical cross-section in an arced shape so as to present an outer concave surface, and the outer concave surface has an arc of a radius of 1–5 mm.

17. A low pressure CVD system according to claim 9, wherein the upper wall, the circumferential wall and the flange, and the padding have silicon impregnated therein.

18. A low pressure CVD system comprising:

an inner tube having an upper end and a lower end opened, and made of silicon carbide material;

an outer tube surrounding an outer periphery of the inner tube with a predetermined spacing, and having an upper end closed, a lower end opened and a lower periphery formed with a flange;

a base portion for supporting the inner tube and the outer tube at the lower ends thereof, and having a central portion formed with an opening;

a seal ring interposed between a lower surface of the flange of the outer tube and the base portion;

a lid provided for opening and shutting the opening in the base portion; and a furnace wall surrounding a circumferential surface and an upper surface of the outer tube, the surface wall having a heater arranged on an inner side thereof;

wherein the outer tube is made of a silicon carbide material, and the outer tube is primarily supported by having an inner circumferential portion of the flange directly radially inward from the seal ring, said inner circumferential portion of the flange directly or indirectly contacted with the base portion;

wherein the lower surface of the flange of the outer tube is tapered so as to be upwardly slanted in a radially outward direction thereof, the lower surface of the flange has an inner peripheral portion formed to have a curved cross-section, and the curved portion is contacted with and supported directly or indirectly by the base portion.

19. A low pressure CVD system comprising:

an inner tube having an upper end and a lower end opened, and made of a silicon carbide material;

an outer tube surrounding an outer periphery of the inner tube with a predetermined spacing, and having an upper end closed, a lower end opened and a lower periphery formed with a flange;

a base portion for supporting the inner tube and the outer tube at the lower ends thereof, and having a central portion formed with an opening;

a seal ring interposed between a lower surface of the flange of the outer tube and the base portion;

a lid provided for opening and shutting the opening in the base portion; and a furnace wall surrounding a circumferential source and an upper surface of the outer tube, the furnace wall having a heater arranged on an inner side thereof;

wherein the outer tube is made of a silicon carbide material, and the outer tube is primarily supported by having a inner circumferential portion of the flange radially inward from the seal ring, said inner circumferential portion of the flange directly or indirectly contacted with the base portion, and wherein the lower end of the outer tube is distant from the lowest portion of the heater by not less than 200 millimeters.

* * * * *